US012695052B2

(12) United States Patent
Wang et al.

(10) Patent No.: US 12,695,052 B2
(45) Date of Patent: Jul. 28, 2026

(54) CONDENSATE PRECURSORS AND CONTAMINANT PURGE APPARATUS AND METHODS

(71) Applicant: FEI Company, Hillsboro, OR (US)

(72) Inventors: Jing Wang, Lake Oswego, OR (US); Chad Rue, North Plains, OR (US); Aurelien Philippe Jean Maclou Botman, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 609 days.

(21) Appl. No.: 18/092,103

(22) Filed: Dec. 30, 2022

(65) Prior Publication Data

US 2024/0222068 A1     Jul. 4, 2024

(51) Int. Cl.
*H01J 37/26* (2006.01)
*C23C 16/06* (2006.01)
(Continued)

(52) U.S. Cl.
CPC ............ *H01J 37/261* (2013.01); *C23C 16/06* (2013.01); *C23C 16/4408* (2013.01);
(Continued)

(58) Field of Classification Search
None
See application file for complete search history.

(56) References Cited

U.S. PATENT DOCUMENTS 9,786,469 B2 * 10/2017 Wang .................... H01J 37/261
2002/0102861 A1 * 8/2002 Bassom ................. H10D 1/474
438/785

(Continued)

FOREIGN PATENT DOCUMENTS

DE         4441117 C1 * 10/1995   ........ H01J 37/32834
EP         2626886 A2 * 8/2013   .............. G01N 1/42
JP         2017-84743 A   5/2017

OTHER PUBLICATIONS

Xue et al., "Organometallic chemical vapor deposition of platinum. Reaction kinetics and vapor pressures of precursors". Chemistry of Materials 1992 4 (1), 162-166. DOI: 10.1021/cm00019a032 (Year: 1992).*

(Continued)

*Primary Examiner* — David E Smith
*Assistant Examiner* — Alina Kaliszewski

(57) ABSTRACT

Methods include arranging a substrate in a vacuum chamber of a charged particle beam microscope, wherein the substrate is held at a cryogenic temperature, and depositing on the substrate at the cryogenic temperature a condensate precursor that is stored in a crucible, wherein the deposited condensate precursor forms a deposition layer on the substrate. An apparatus include a vacuum chamber configured to support a substrate, a condensate precursor system coupled to the vacuum chamber, wherein a vacuum pump is configured to draw a vacuum on a storage reservoir to reduce a vapor pressure build-up of a one or more volatile contaminants in the storage reservoir and thereby reduce a deposition of the one or more contaminants on the substrate during the condensing of the condensate precursor on the substrate. A condensate precursor can comprise a transition metal center comprising hafnium or osmium. Related deposition and cap layers are disclosed.

19 Claims, 3 Drawing Sheets

(51) Int. Cl.
   *C23C 16/44*      (2006.01)
   *C23C 16/455*     (2006.01)
   *G01N 1/42*       (2006.01)
   *H01J 37/18*      (2006.01)
(52) U.S. Cl.
   CPC ......... *C23C 16/45559* (2013.01); *G01N 1/42*
            (2013.01); *H01J 37/18* (2013.01); *H01J*
               *2237/022* (2013.01); *H01J 2237/186*
               (2013.01); *H01J 2237/2001* (2013.01)

(56)              References Cited

U.S. PATENT DOCUMENTS

| | | | | |
|---|---|---|---|---|
| 2004/0124131 | A1* | 7/2004 | Aitchison | B01D 45/06 210/252 |
| 2005/0208754 | A1* | 9/2005 | Kostamo | H10W 20/094 438/622 |
| 2006/0068373 | A1* | 3/2006 | Bose | G01N 21/6456 435/6.12 |
| 2007/0154637 | A1* | 7/2007 | Shenai-Khatkhate | C30B 25/02 427/248.1 |
| 2008/0230854 | A1* | 9/2008 | Clark | H10D 64/01342 257/E29.345 |
| 2008/0293832 | A1* | 11/2008 | Yokoi | H01J 37/20 422/400 |
| 2010/0255213 | A1 | 10/2010 | Faber et al. | |
| 2011/0250126 | A1* | 10/2011 | Ivanov | C23C 16/18 556/54 |
| 2012/0003394 | A1* | 1/2012 | Mulders | C23C 16/486 427/551 |
| 2012/0045589 | A1* | 2/2012 | Ivanov | C23C 16/405 427/248.1 |
| 2012/0199923 | A1* | 8/2012 | Nadeau | G11B 5/3163 257/E29.323 |
| 2015/0021775 | A1* | 1/2015 | Matsumoto | H01L 21/76864 438/786 |
| 2015/0092924 | A1* | 4/2015 | Yun | H01J 35/105 378/143 |
| 2015/0243478 | A1* | 8/2015 | Lee | H01J 37/28 204/192.33 |
| 2017/0002467 | A1* | 1/2017 | Straw | H01J 37/08 |
| 2020/0335309 | A1* | 10/2020 | Schmaunz | H01J 37/145 |
| 2021/0123143 | A1* | 4/2021 | Fenwick | C23C 16/505 |
| 2021/0348266 | A1* | 11/2021 | De Teresa Nogueras | C23C 16/463 |
| 2021/0381107 | A1* | 12/2021 | Smythe | C23C 16/503 |
| 2023/0236095 | A1* | 7/2023 | Giannuzzi | G01N 1/42 73/863.11 |

OTHER PUBLICATIONS

Smart et al., "Chemical vapor deposition of ruthenium and osmium films from mono- and bis-(cyclopentadienyl) complexes as precursors". MRS Online Proceedings Library 363, 207-212 (1994). https://doi.org/10.1557/PROC-363-207 (Year: 1994).*
English machine translation for DE-4441117-C1 (Year: 1995).*
CAS SciFinder Substance Properties: Copper (Year: 2025).*
CAS SciFinder Substance Properties: trimethyl(methylcyclopentadienyl)platinum(IV) (Year: 2025).*
Bresin, M., Thiel, B.L., Toth, M. et al. Focused electron beam-induced deposition at cryogenic temperatures. Journal of Materials Research 26, 357-364 (2011). https://doi.org/10.1557/jmr.2010.59 (Year: 2011).*
M Bresin et al 2013 Nanotechnology 24 035301. DOI 10.1088/0957-4484/24/3/035301 (Year: 2013).*
Botman et al., "Creating pure nanostructures from electron-beam-induced deposition using purification techniques: a technology perspective," *Nanotechnology*, 20(37): 372001 (Aug. 2009).
Hirt et al., "Additive manufacturing of metal structures at the micrometer scale," *Advanced Materials*, 29(17): 1604211 (Jan. 2017).
Partial European Search Report from EP Application No. 23219066.0, 20 pp., dated Aug. 30, 2024.
Extended European Search Report from EP Application No. 23219066.0, 19 pp., dated Jan. 23, 2025.

* cited by examiner

CONDENSATE PRECURSORS AND CONTAMINANT PURGE APPARATUS AND METHODS

FIELD

The field is electron microscopy, and more particularly cryogenic electron microscopy.

BACKGROUND

Cryogenic electron microscopy "cryo-EM" is an expanding field of technology in which samples are cooled and analyzed at cryogenic temperatures. The cooler temperatures allow the integrity of various structures to be maintained during imaging and other processing. In particular, cryo-EM allows detailed imaging and analysis of biological samples before sample degradation can occur. For example, operating under cryo conditions can allow for examination of biological tissue (which contains a lot of water) in the vacuum environment of a charged particle microscope, such as a FIB/SEM dual beam system. In general, hydrated samples are not compatible with vacuum due to the likely desorption of water. For such samples to be processed and imaged in a charged particle microscope, they must be frozen to prevent the water from evaporating, which would be harmful to the vacuum system of the instrument and which would cause distortions and damage to the sample. An alternative to freezing is to dehydrate samples and embed them in a plastic resin before loading them into the FIB/SEM instrument. However, there are concerns that such an invasive process can perturb the fine biological structures. Operating under cryo conditions maintains the sample in a more natural state and cryo conditions may make a sample less susceptible to degradation during SEM imaging. Unfortunately, such degradation often does occur, even at cryogenic temperatures and results in unsuccessful or lower quality imaging.

Accordingly, a need remains for improved techniques relating to cryogenic microscopy.

SUMMARY

According to an aspect of the disclosed technology, methods include arranging a substrate in a vacuum chamber of a charged particle beam microscope, wherein the substrate is held at a cryogenic temperature, and depositing on the substrate at the cryogenic temperature a condensate precursor that is stored in a crucible, wherein the deposited condensate precursor forms a deposition layer on the substrate. In some examples, the depositing comprises depositing a chemical compound comprising a transition metal. In some examples, the depositing comprises depositing a chemical compound comprising an osmium or hafnium metallic center. In some examples, the depositing comprises depositing a chemical compound comprising bis-cyclopentadienyl osmium. In some examples, the depositing comprises depositing a chemical compound comprising cyclopentadienyl dimethyl hafnium. In some examples, the arranging a substrate comprises arranging a substrate that includes a vitrified sample, wherein the vitrified sample includes water ice. In some examples, the depositing a condensate precursor comprises depositing a condensate precursor having a lower vapor pressure than trimethyl (methylcyclopentadienyl)platinum(IV). In some examples, the depositing a condensate precursor comprises depositing a condensate precursor from a bulk material stored in the crucible, wherein the bulk material includes one or more contaminant volatile chemicals having respective vapor pressures higher than a vapor pressure of the condensate precursor. Some examples further include, before depositing the condensate precursor, applying a vacuum to the bulk material stored in the crucible, wherein the source of the vacuum is different from that of the vacuum chamber, to remove one or more of the contaminant volatile chemicals that are situated in a vapor phase in the crucible to reduce the amount of the contaminant volatile chemical present in the deposition layer. In some examples, the vacuum is applied for a selected duration, or an open duration, before the depositing of the condensate precursor. In some examples, depositing the condensate precursor comprises, with the condensate precursor stored at an elevated temperature relative to the cryogenic temperature of the vacuum chamber, opening a valve to allow the condensate precursor in a vapor phase to flow from the crucible to the chamber and to condense on the substrate in response to the cryogenic temperature. In some examples, the depositing comprises depositing a condensate precursor on the substrate at the cryogenic temperature in the range of −150 to −180° C. from a condensate precursor crucible held at a temperature in the range of 50-70° C. In some examples, the depositing a condensate precursor at the cryogenic temperature to form a cap layer comprises forming an electrically conductive cap layer. In some examples, the depositing a condensate precursor comprises releasing the condensate precursor into the vacuum chamber for a controlled duration associated with a controllable thickness of the deposition layer that is formed. In some examples, the releasing the condensate precursor into the vacuum chamber for a duration associated with a thickness of the deposition layer that is formed comprises releasing the condensate precursor at a condensate thickness growth rate of about 2-20 nm/sec. Some examples further include directing an electron beam or ion beam to the substrate during the depositing the condensate precursor, such that the charged particle beam partially decomposes the condensate precursor during formation of the deposition layer. Some examples further include directing an ion beam to the formed deposition layer to mill a portion of the deposition layer and substrate and expose a cut face for analysis. Some examples further include reducing the curtaining artifacts associated with the milling by controlling a thickness of the deposition layer formed during the depositing and controlling an etch rate of the milling. In some examples, the charged particle beam microscope comprises an electron beam column and an ion beam column.

According to another aspect of the disclosed technology, apparatus include a vacuum chamber configured to support a substrate, a condensate precursor system coupled to the vacuum chamber, wherein the condensate precursor system include a storage crucible configured to store a bulk precursor condensate material in a storage reservoir, the bulk precursor condensate material including a condensate precursor and one or more volatile contaminants, a vacuum chamber outlet valve coupled to the storage reservoir and configured to release a vapor phase of the condensate precursor into the vacuum chamber to condense on the substrate, at least one vacuum pump, a vacuum valve coupled to the vacuum pump, and a feedthrough coupling the storage reservoir to the vacuum pump through the vacuum valve, wherein the vacuum pump is configured to draw a vacuum on the storage reservoir to reduce a vapor pressure build-up of the one or more volatile contaminants in the storage reservoir and thereby reduce a deposition of the one or more contaminants on the substrate during the condensing of the condensate precursor on the substrate. Apparatus can also include any apparatus configured to perform the methods described above and hereinbelow.

According to another aspect of the disclosed technology, an electrically conductive sample cap layer includes a condensed precursor, wherein the condensate precursor includes a transition metal center and wherein the vapor phase of the precursor has a vapor pressure that is lower than a vapor pressure of a vapor phase of a corresponding precursor having a platinum center. Example cap layers can be formed with the apparatus and/or methods described herein.

According to another aspect of the disclosed technology, a condensate precursor includes a transition metal center comprising hafnium or osmium.

The foregoing and other objects, features, and advantages of the disclosed technology will become more apparent from the following detailed description, which proceeds with reference to the accompanying figures.

DETAILED DESCRIPTION

Figure 1:
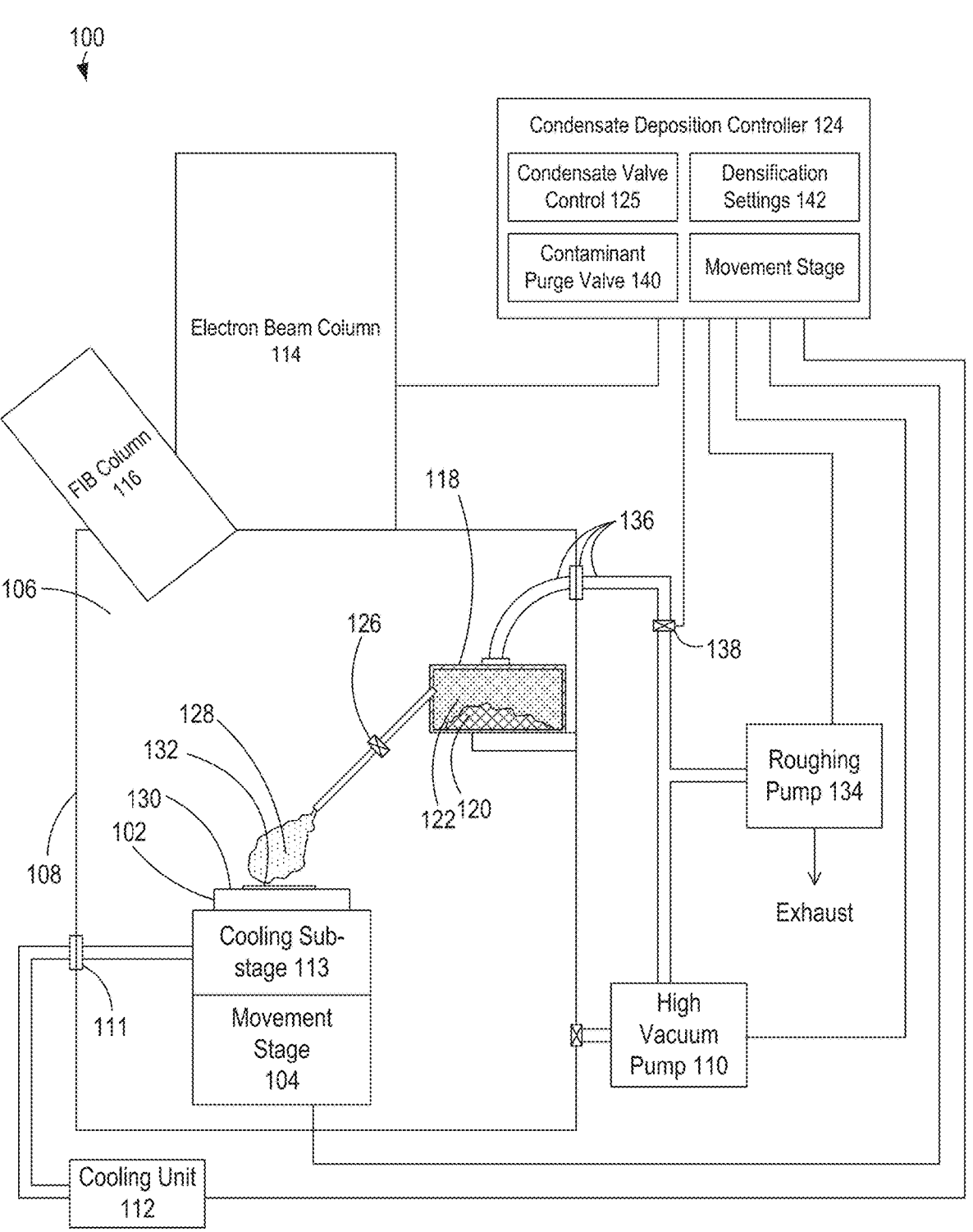
FIG. 1 is a schematic of an example charged particle beam apparatus.

Cap layers also can be formed on samples prior to milling with a focused ion beam. Their function can be to protect the sample's top-most surface from ion beam damage, and to allow a cleaner cross-sectional cut with the FIB. In room temperature applications, protective caps are deposited by ion beam-induced decomposition of gas chemistries such as tungsten hexacarbonyl or trimethyl(methylcyclopentadienyl)platinum(IV). However, as discussed further hereinbelow, it has been found that at cryogenic temperatures these gas precursors condense indiscriminately on the surface of the sample, without the need for ion beam-induced decomposition. Such condensate films have very different properties from beam-deposited films, are susceptible to various problems, such as curtaining artifacts, and tend to be avoided in cryo-EM sample preparation processes.

One technique to reduce or eliminate such problems is disclosed herein. Examples of the disclosed technology include precursor condensates that can be used at cryogenic conditions, apparatus and methods to form protective cap layers under cryogenic temperatures while removing contaminants, and apparatus and methods to differentially pump chemistry containers. In some examples, bis-cyclopentadienyl osmium (e.g., also known as "osmacene," CAS Number 1273-81-0) and cyclopentadienyl dimethylhafnium (e.g., dimethylbis(cyclopentadienyl)hafnium(IV); CAS Number: 37260-88-1) are used as precursors to provide condensate layer protective caps. Such precursors can replace the standard Pt precursor, trimethyl(methylcyclopentadienyl)platinum(IV), as a precursor in gas injection systems (GIS) of cryo-EM systems, and be used in existing cryogenic sample preparation workflows, e.g., in life science applications.

Standard Pt precursors used in FIB/SEM gas injection systems (GISs) are rated as highly toxic. For example, there are safety concerns about the decomposition byproducts after going through pumping systems, including in-situ accumulation and exposure to condensed precursor in-chamber, and on sample holders under cryogenic conditions. Some precursors containing osmium or hafnium both exhibit promising advantages, including a lower toxicity than platinum, a lower vapor pressure than platinum (which can provide improved layer control and longer lifetime), and the capability of improved cryogenic deposition characteristics with simultaneous exposure with a plasma focused ion beam (PFIB). In experiments, the resulting layers are smooth and reproducible. Further, the quality of the cut face exhibits characteristics consistent with suitability for further use in lamella preparation.

In further disclosed examples, it has been found that high vapor pressure contaminant sources in the stock material of the precursors can be problematic, impacting the long-term stability and performance of these precursors. Such contaminants can be released with a very long period of outgassing, but this can take anywhere from several minutes to 100s of hours, depending on the nature of the precursor, the initial purity of the chemical, and the conduction pathway of the pumping system. In addition to being very time-consuming, the purging process can expose the instrument to harmful levels of chemistry. In many FIB/SEM chemical delivery systems, the vessels ("crucibles") containing the precursor substances are connected to a small diameter tube which transports the precursors to the region of interest on the sample. An on/off valve can allow admission of the precursor into the instrument, and the vapor pressure can be controlled by setting the temperature of the crucible. In many examples, the only exit path out of the crucible for the precursor (and any impurities) is through the final on/off valve and into the vacuum chamber. In such examples, therefore, any purging processes intended to eliminate impurities in the crucible require flowing chemistry into the instrument vacuum chamber. At cryogenic temperatures such purge processes can result in continuous condensation of chemicals on one or more of the cold surfaces of the instrument during the entire purge cycle. This can pose serious problems to the lifetime of sensitive components and a safety hazard when the cold components are warmed up again and the condensed material is vaporized and released into the vacuum chamber.

In some disclosed examples, a differentially pumped crucible can be actively pumped while not in use. A differentially pumped crucible is defined as one in which a secondary vacuum connection is present. As described above and further discussed below along with related illustrations, the crucible's primary connection to the vacuum is through the main on/off valve and into the chamber for the purposes of delivering the precursor to the sample. The second vacuum connection is usually a section of tubing that connects the crucible to a vacuum pump. This vacuum pump can be a dedicated mechanical roughing pump, or it can correspond to a roughing pump that backs a turbo pump of the instrument vacuum chamber. In the latter case, it can be important that that outlet of the differentially pumped line joins the pumping manifold downstream from the turbo pump. In some examples, after running a continuous purge on the crucible with the roughing pump (e.g., by opening a purge valve and closing a gas flow on/off valve) and pumping the chamber to high vacuum with a high vacuum pump, the purge valve can be closed allowing the crucible to be pumped to roughing pressure, and then the gas flow on/off valve can be opened to allow a flow of vapor phase into the chamber. The amount of precursor that flows from the crucible to the chamber can be based on the temperature of the crucible rather than the pressure difference between the roughing pump and the chamber vacuum. For example, when the valve to the roughing pump is closed, the pressure in the crucible will rise to the intrinsic vapor pressure of the precursor, which is determined by the temperature of the crucible. With differential pumping, a pure, stable precursor flow can be achieved without the need to purge directly into the instrument chamber. In some examples, it may be desirable to continuously purge a crucible so that it is ready for use on-demand with consistent performance.

FIG. 1 is an example charged particle beam system 100 configured to process a sample 102 at cryogenic temperatures. The sample 102 can be arranged on a support structure, such as a movement stage 104, within an interior volume 106 of a vacuum chamber 108. A vacuum pump 110 can be coupled to the vacuum chamber 108 to reduce the internal pressure of the volume 106. Example internal pressures can be below about $1 \times 10^{-3}$ torr, e.g., below $1 \times 10^{-4}$ torr, $1 \times 10^{-5}$ torr, $1 \times 10^{-6}$ torr, etc. In many examples, when not flowing precursor substances, chamber pressures are usually in the range $5 \times 10^{-7}$ to $5 \times 10^{-6}$ mbar. When flowing precursor substances, the chamber pressure can increase from $5 \times 10^{-6}$ up to $2 \times 10^{-5}$ mbar. A cooling unit 112 can also be coupled to the vacuum chamber 108 to reduce and maintain the temperature of the sample 102 in the chamber 108 at cryogenic temperatures (e.g., between 0 K and about 120 K). In representative examples, the cooling unit 112 is coupled through a cryogenic feedthrough 111 into the chamber 108 directly to a cooling sub-stage 113 (e.g., as part of or coupled to the movement stage 104). Cooling only the stage 104 can provide controlled cooling of the sample 102. An electron beam column 114 can be arranged to direct an electron beam to the sample 102 to produce images. A focused-ion beam column 116 can be arranged to direct an ion beam to process the sample 102, e.g., for milling or cutting the sample 102, or in some examples for densifying a condensing cap layer (discussed further hereinbelow). To streamline and provide clarity of illustration, other components that can be present are not shown, such as imaging detectors, lenses, scanning elements, etc.

The system 100 further includes a condensate crucible 118 (shown in cross-section) situated in the vacuum chamber 108 and configured to store a chemical supply of a bulk condensate precursor. It will be appreciated that in some examples the crucible 118 can also be located outside the vacuum chamber 108 (e.g., attached to the exterior of the vacuum chamber 108) or formed into a wall structure of the vacuum chamber 108. The crucible 118 can be held at a fixed temperature, typically in the range of 60° C. to 70° C., and at the storage temperature the condensate precursor includes a portion in a solid state 120 and portion in a vapor state 122. In many examples, the temperature of the crucible or stored precursor substance can be set by the user and can be changed. The system 100 can be configured to monitor the temperature and provide adjustments, e.g., to heating elements, as needed to keep the temperature at the set point. In some examples, the temperature control can include different temperature zones along a length of the flow pathway of the precursor substance. At a selected time, a condensate deposition controller 124 (which can be part of or separate from a larger control system of the system 100 controlling other charged particle beam system functions) can be configured with a condensate valve control 125 to cause a crucible valve 126 to open and allow condensate precursor vapor 122 to flow into the volume 106 as condensate precursor vapor 128. A portion of the vapor 128 condenses on a surface 130 of the sample 102 to form a thin cap layer 132, e.g., deposition layer.

In some examples, the cap layer 132 is electrically conductive to dissipate charge and thereby reduce charge-induced imaging artifacts. Such artifacts can be particularly problematic for imaging at cryogenic temperatures. While various precursors can condense, if the precursor molecule does not contain a metal atom then the film will not be conductive and imaging artifacts can be produced due to local charge build-up. In fact, even many organometallic precursors condense into films that are electrical insulators, despite the presence of metal atoms in the precursor molecules. This is because it takes energy (usually from the ion or electron beam) to decompose the precursor molecules and concentrate the metal atoms in the film sufficiently to achieve desired electrical properties. Nevertheless, organo-metallic precursors are viewed as more promising than precursors without metal centers, and therefore example condensate precursors disclosed herein for use at cryogenic temperatures generally comprise organo-metallic compounds.

In representative examples, the sample 102 can be a vitrified sample that includes water ice. Many samples can be biological in nature. The cap layer 132 can provide a protective layer over the surface 130 for improved milling and/or etching to prepare the sample 102 for high resolution imaging. For example, the presence of the cap layer 132 before cutting, e.g., milling, can provide a cleaner cross-sectional cut face showing the interior contents of the sample 102 below the surface 130, as well as eliminating some curtaining artifacts, i.e., vertical striations on the cut face that disrupt or degrade an image.

Various compounds can be used for the condensate precursor that is used to form the cap layer. In some examples herein, the condensate precursor can include or be a tungsten hexacarbonyl compound or a platinum compound. In some preferred examples herein, and particularly well-suited for cryogenic temperature apparatus and processing techniques, the condensate precursor can include a compound having a metal center that is hafnium or osmium. In some examples, the compound can be identical to a customary platinum compound but with hafnium or osmium as the metal center. In further examples, a compound may be used as the condensate precursor that has a metal center different from tungsten, platinum, hafnium, or osmium, such as Mo, Fe, Co, Cu, Mn, Ni, Cr, or Al, though another metal from the periodic table can be selected as well. In selected examples, the condensate precursor compound can be or include bis-Cyclopentadienyl osmium. In further examples, the condensate precursor compound can be or include Cyclopentadienyl dimethylhafnium.

In cryogenic examples, hafnium- or osmium-based condensate precursors have been found to be advantageous in various ways. For example, the vapor pressures of hafnium and osmium precursor compounds such as bis-Cyclopentadienyl osmium and Cyclopentadienyl dimethylhafnium are lower than platinum-based precursor compounds over similar temperature and pressure conditions. The lower vapor pressure allows better control over the condensation of the precursor as it is released into the cryogenic environment. In contrast, with their higher vapor pressures, platinum-based precursors tend to condense quickly and grow aggressively on a sample surface, making it difficult to control the thickness of the cap layer 132 that forms on the surface 130. Furthermore, platinum precursors and other precursors can have an associated toxicity that is higher than hafnium- and osmium-based precursors.

A further advantage associated with the lower vapor pressure precursors relates to contaminant build-up in the crucible 118. In some examples of the system 100, the crucible 118 can be coupled to a vacuum pump 134, which can be the same or different than the pump 110. In representative examples, the pump 134 can be situated external to the chamber 106 and vacuum coupled via a feedthrough 136 into the chamber 106 and to the crucible 118. In some examples, a purge valve 138 can be situated to selectively control the vacuum applied via the feedthrough 136. The controller 124 or a separate controller can be configured with a purge valve control 140 to control the pump 134 and/or purge valve 138 to selectively apply a vacuum to the internal volume of the crucible 118 to differentially pump the internal volume relative to the vacuum chamber 106 and/or outside environment. The vacuum can be applied before the condensate precursor vapor 128 is released into the volume 106 of the chamber 108, e.g., before deposition to form the cap layer 132. The vacuum can be applied to remove a significant fraction of the vapor contents stored in the crucible 118. In some examples, the vacuum can be applied constantly or for extended durations preceding a deposition. In further examples, the vacuum can be applied for shorter durations preceding a deposition. In further examples, the vacuum can be applied periodically.

In particular, the application of the vacuum can remove condensate precursor in the vapor state 122 while also removing undesirable contaminants that can be mixed with the vapor state 122. The undesirable contaminants can be present in small amounts by being mixed with the solid state 120 of the condensate precursor or as byproducts. The contaminants typically have a higher vapor pressure than the condensate precursor and can outgas from a solid state (mixed in with the solid state 120) into the gas volume of the crucible 118 filled by the vapor state 122. Over time, such as hours to days, partial pressure of the contaminants increases within crucible 118. Thus, when the crucible valve 126 is opened to allow flow into the volume 106, a large amount of contaminants are also released and can thereby undesirably form a significant fraction of the contents of the cap layer 132. Increase in contaminant concentration over time can relate to outgassing and/or decomposition into volatile byproducts, e.g., due to impurities and/or chemical instabilities. Contaminant release can be more problematic under cryogenic conditions than non-cryogenic conditions. For example, contaminants can be problematic even if the sample 102 is not present or moved to an out-of-the-way position, as contaminants can condense on any cold chamber surface. By applying the vacuum to the crucible 118 with the pump 134, the contaminants can be removed before opening the valve 126. The pressure applied to the crucible 118 via the pump 134 can be a rough vacuum pressure in many examples, e.g., about $1\times10^{-3}$ torr or greater, $1\times10^{-2}$ torr or greater, $1\times10^{-1}$ torr, etc.

In many examples, the differential pumping can allow processing of the sample 102 routinely without requiring consideration of the presence of contaminants because they are removed in an on-going fashion or with a sequential processing step that can be performed automatically before release of the vapor state 122. For example, there can be enough chemical precursor stored in the crucible 118 such that a continuous vacuum drawn on the crucible 118 does not reduce the lifetime of the stored precursor below an unusable or impractical duration. The lower vapor pressure of the vapor state 122 of the solid 120 can be advantageous as the vapor state 122 can be formed through sublimation of the solid state 120 at a slower rate, allowing the volume of the solid state 120 to decrease more slowly to further the lifetime of the precursor bulk stored in the crucible 118, and to allow the higher vapor pressure contaminants to be pulled away quickly through the differential pumping. Control over the cap layer 132 can be further enhanced by the selection of the condensate precursor with lower vapor pressure characteristics. Control over the cap layer 132 formation, including thickness and/or speed of growth, can be further advantageous so that an etch rate of the cap layer 132 under various processes such as cutting or milling can be matched to the underlying material of the sample 102, such as ice. Such matching can reduce problems associated with the cut face of the sample 102, such as curtaining. In some examples, controlled growth rates can include 0.1 nm/sec, 1 nm/sec, 2 nm/sec, 10 nm/sec, 20 nm/sec, 100 nm/sec, etc. In some examples, 2-10 nm/sec is a convenient growth rate.

In some examples, the controller 124 can be configured with densification beam settings 142 to control delivery of a densification beam. The controller 124 can correspond to a controller or processing unit for controlling the electron beam column 114 and/or FIB column 116, by way of example. A FIB or an electron beam can correspond to the densification beam, which can be configured to irradiate a region of interest while the precursor is condensing. The energy of the FIB or electron beam can partially decompose the film, resulting in a "densified" condensate with slightly preferable properties as compared to a non-densified film. These properties may include: less voids, inclusions, or bubbles in the film, better resistance to the ion beam during subsequent FIB milling steps (some films are too delicate and ephemeral, and they disappear completely at the slightest beam exposure), and/or less tendency for the condensate to "flow," or move around in response to FIB milling. If a film exhibits this "reflow" tendency, it can be difficult to obtain clean cross-sectional cuts in a desired location, because the mobile cap does not allow the formation of a well-defined edge at the desired location. In some examples, whether a FIB or an electron beam is used to "densify" the condensate can be decided by an operator during the deposition process. Herein, the term "densification" and "densify" do not necessarily imply that the beam produces a change in density of a target material, though changes in density are possible. In general, such terms refer to a change in the target material that is caused at least in part by the presence of an ion or electron beam's energy. For example, the densification beam can partially decompose the condensing precursor, thereby providing the cap layer 132 with improved mechanical and/or electrical properties. For example, a post-milling reflow rate of the cap layer 132 can be improved such that less of a portion of the cap layer 132 reflows to obscure a cut face of the sample 102. In some examples, the densification beam can be an ion beam provided by the FIB column 116. Example ion species can include gallium, xenon, argon, nitrogen, oxygen, etc. In further examples, the densification beam can be provided by the electron beam column 114. In some examples, the densification beam can be scanned across the surface 130 of the sample 102. In further examples, the densification beam can have an area extending over an entirety or substantial portion of the area of the surface 130. Herein, the densification beam process is not the same as ion beam induced deposition, which is a separate, known technique performed at room temperature. Although existing room-temperature beam-induced deposition techniques also involve decomposition of a gas precursor in response to energy from a charged particle beam, one distinction between such room temperature processes and examples according to the disclosed technology herein involving the deposition of condensate films at cryogenic temperatures with beam densification is that the beam-induced deposition component is happening simultaneously with the temperature-induced condensation component.

Figure 2:
FIG. 2 is a schematic of an example purge apparatus.
Figure 2:
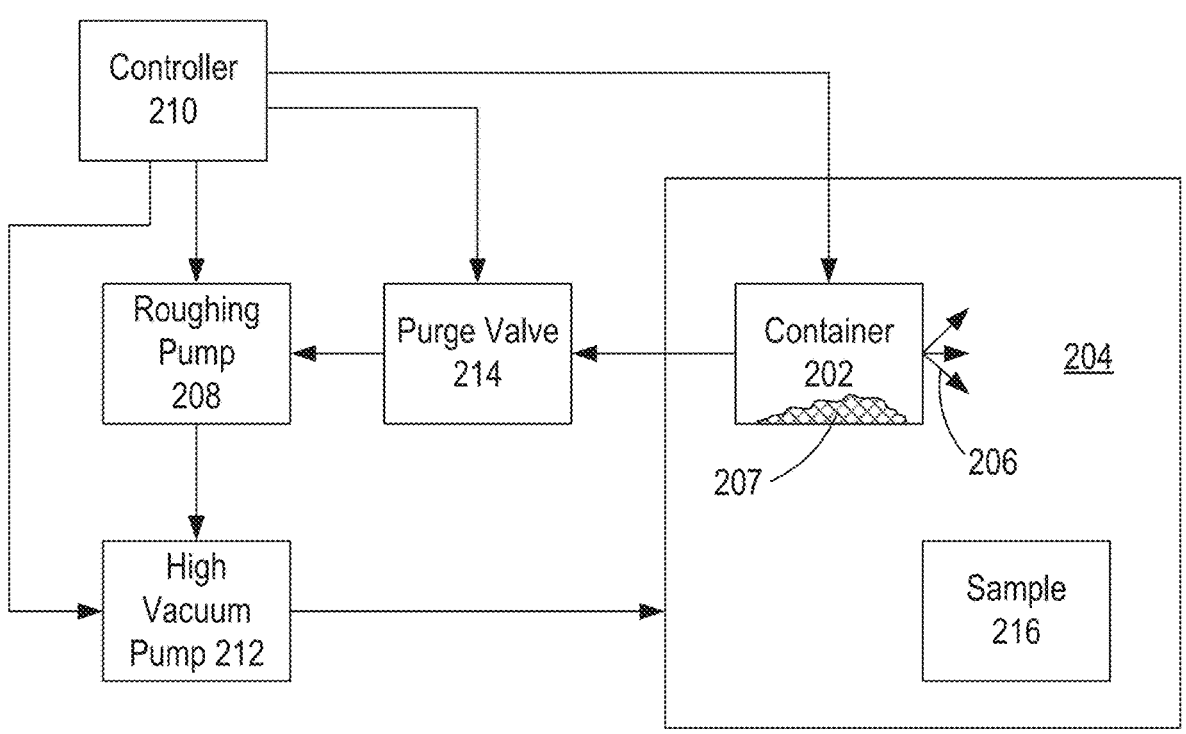

FIG. 2 is an example differential vacuum pumping system 200 that can be used to remove unwanted contaminant vapors from a chemistry storage container 202 without requiring the contaminants to flow into a vacuum chamber 204. For example, a precursor 206, which can include a solid phase 207, can be stored in the container 202, and the differential pumping can allow the flowing of the precursor 206 into the vacuum chamber 204 with reduced contaminants. The system 200 can include a roughing vacuum pump 208 and pump controller 210 coupled to at least the pump 208 to control the differential pumping applied to the container 202. A high vacuum pump 212 can be coupled to the roughing vacuum pump 208 and pump controller 210 to provide a higher vacuum for the vacuum chamber 204. A purge valve 214 can be arranged between the container 202 and the roughing pump 208 to allow the differential pumping of a pressure of the container 202 relative to the vacuum chamber 204. In some examples, the precursor 206 can be flowed on-demand into the vacuum chamber 204, e.g., to be condensed on a sample 216. In some examples, the purging can occur automatically in the background (via connection to pump 208), e.g., while the system is operational or the container 202 contains a precursor substance, or in response to a command to initiate a flow of the condensate 206 into the chamber 204.

Figure 3:
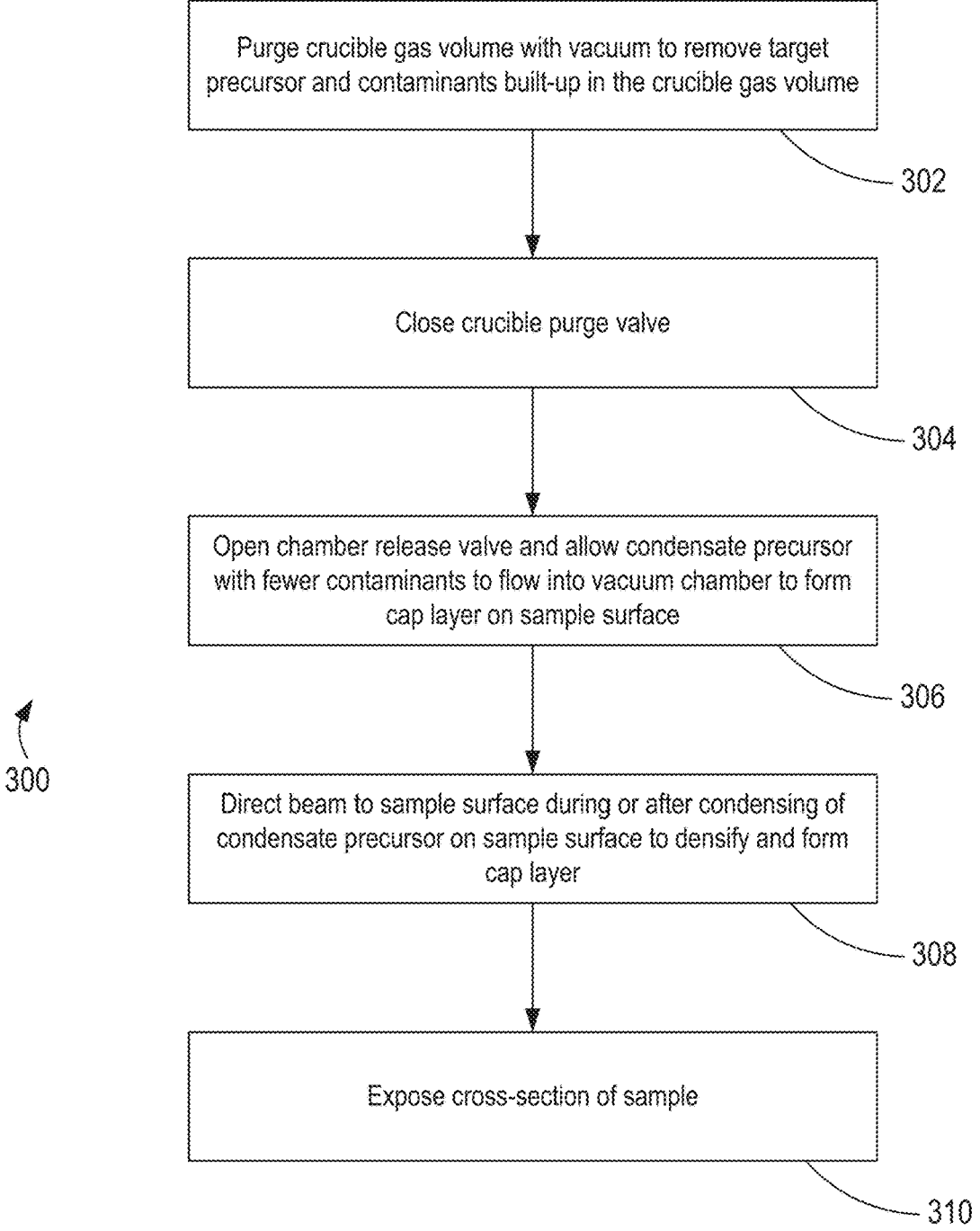
FIG. 3 is a flowchart of methods that can be used for purging crucible storage containers and/or forming protective cap layers.

FIG. 3 shows various methods 300 of forming condensate layers. At 302, the gas volume of a crucible situated in a vacuum chamber and storing a condensate precursor can be purged using a pump configured to differentially pump the crucible in relation to the pressure conditions of the vacuum chamber. In some examples, a stage inside the vacuum chamber can be configured to be maintained at cryogenic temperatures. By differentially pumping the crucible to purge the gas volume within, built-up contaminants can be removed from the storage volume of the crucible to decrease the contaminant level of the condensate gas subsequently stored or released from the crucible. At 304, the purge valve removing the condensate gas and contaminants from the crucible gas volume can be closed. Various timings can be used for differential pumping, including an always-on purge, a periodic purge, a pre-release purge, etc. At 306, a chamber release valve can be opened that allows condensate precursor vapor to flow into the chamber, e.g., to form an electrically conductive protective deposition layer on a sample surface. In some examples, a densification beam can be directed at 308, to the sample surface on which the precursor is condensing or has condensed, in order to densify the formed cap layer. Various further sample processing steps can be performed, such as ion beam milling to expose a cross-section of the sample, at 310.

GENERAL CONSIDERATIONS

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Portions of disclosed techniques and processes can be embodied as software or firmware instructions carried out by one or more controllers, such as a digital computer. For instance, control over any of the disclosed deposition or beam processing techniques can be performed by a computer or other computing hardware (e.g., an ASIC or FPGA) that is part of a charged particle microscope system. The charged particle microscope system can be connected to or otherwise in communication with the various vacuum components and/or beam delivery components and be programmed or manually configured by an operator to purge contaminants and/or deposit condensate films and cap layers. The computer can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques. The results of the deposition, purge, or other described processes, as well as any obtained microscope images, can be stored in the one or more tangible, non-transitory computer-readable storage media and/or can also be output to the user, for example, by displaying, on a display device.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. A method, comprising:

arranging a substrate in a vacuum chamber of a charged particle beam microscope, wherein the substrate is held at a cryogenic temperature; and depositing on the substrate at the cryogenic temperature a condensate precursor comprising a chemical compound comprising an osmium or hafnium metallic center that is stored in a crucible, wherein the deposited condensate precursor forms a deposition layer on the substrate.

2. The method of claim 1, wherein the depositing comprises depositing a chemical compound comprising bis-cyclopentadienyl osmium.

3. The method of claim 1, wherein the depositing comprises depositing a chemical compound comprising cyclopentadienyl dimethyl hafnium.

4. The method of claim 1, wherein the arranging a substrate comprises arranging a substrate comprising a vitrified sample that includes water ice.

5. The method of claim 1, wherein the depositing a condensate precursor comprises depositing a condensate precursor having a lower vapor pressure than trimethyl (methylcyclopentadienyl) platinum (IV).

6. The method of claim 1, wherein the depositing a condensate precursor comprises depositing a condensate precursor from a bulk material stored in the crucible, wherein the bulk material includes one or more contaminant volatile chemicals having respective vapor pressures higher than a vapor pressure of the condensate precursor.

7. The method of claim 6, further comprising, before depositing the condensate precursor, applying a vacuum to the bulk material stored in the crucible, wherein the source of the vacuum is different from that of the vacuum chamber, to remove one or more of the contaminant volatile chemicals that are situated in a vapor phase in the crucible to reduce the amount of the contaminant volatile chemical present in the deposition layer.

8. The method of claim 7, wherein the vacuum is applied for a selected duration, or an open duration, before the depositing of the condensate precursor.

9. The method of claim 1, wherein the depositing the condensate precursor comprises, with the condensate precursor stored at an elevated temperature relative to the cryogenic temperature of substrate in the vacuum chamber, opening a valve to allow the condensate precursor in a vapor phase to flow from the crucible to the chamber and to condense on the substrate in response to the cryogenic temperature.

10. The method of claim 1, wherein the depositing comprises depositing a condensate precursor on the substrate at the cryogenic temperature in the range of −150 to −180° C. from a condensate precursor crucible held at a temperature in the range of 50-70° C.

11. The method of claim 1, wherein the depositing a condensate precursor at the cryogenic temperature to form a deposition layer comprises forming an electrically conductive cap layer.

12. The method of claim 1, wherein the depositing a condensate precursor comprises releasing the condensate precursor into the vacuum chamber for a controlled duration associated with a controllable thickness of the deposition layer that is formed.

13. The method of claim 12, wherein the releasing the condensate precursor into the vacuum chamber for a duration associated with a thickness of the deposition layer that is formed comprises releasing the condensate precursor at a condensate thickness growth rate of 2-20 nm/sec.

14. The method of claim 1, further comprising directing an electron beam or ion beam to the substrate during the depositing the condensate precursor, such that the charged particle beam partially decomposes the condensate precursor during formation of the deposition layer, or directing an electron beam or ion beam to the substrate after the depositing the condensate precursor, such that the charged particle beam partially decomposes the condensate precursor after formation of the deposition layer.

15. The method of claim 1, further comprising directing an ion beam to the formed deposition layer to mill a portion of the deposition layer and substrate and expose a cut face for analysis.

16. The method of claim 15, further comprising reducing the curtaining artifacts associated with the milling by controlling a thickness of the deposition layer formed during the depositing and controlling an etch rate of the milling.

17. The method of claim 1, wherein the charged particle beam microscope comprises an electron beam column and an ion beam column.

18. An apparatus, comprising:

a vacuum chamber configured to support a substrate and hold the substrate at a cryogenic temperature;

a condensate precursor system coupled to the vacuum chamber, wherein the condensate precursor system includes:

a storage crucible configured to store a bulk precursor condensate material in a storage reservoir, the bulk precursor condensate material including a condensate precursor and one or more volatile contaminants, a vacuum chamber outlet valve coupled to the storage reservoir and configured to release a vapor phase of the condensate precursor into the vacuum chamber to condense on the substrate that is held at the cryogenic temperature to form a deposition layer on the substrate, at least one vacuum pump, a vacuum valve coupled to the vacuum pump, and a feedthrough coupling the storage reservoir to the vacuum pump through the vacuum valve, wherein the vacuum pump is configured to draw a vacuum on the storage reservoir to reduce a vapor pressure build-up of the one or more volatile contaminants in the storage reservoir and thereby reduce a deposition of the one or more contaminants on the substrate during the condensing of the condensate precursor on the substrate.

19. An electrically conductive sample cap layer, comprising:

a cryogenically condensed precursor, wherein a vapor phase of the condensate precursor includes an osmium or hafnium metal center and wherein the vapor phase of the precursor has a vapor pressure that is lower than a vapor pressure of a vapor phase of a corresponding precursor having a platinum center.

* * * * *